US008834955B2

(12) United States Patent
Bauer et al.

(10) Patent No.: US 8,834,955 B2
(45) Date of Patent: Sep. 16, 2014

(54) METHODS AND APPARATUS FOR A GAS PANEL WITH CONSTANT GAS FLOW

(71) Applicant: ASM America, Inc., Phoenix, AZ (US)

(72) Inventors: Matthias Bauer, Phoenix, AZ (US); Gregory M. Bartlett, Chandler, AZ (US)

(73) Assignee: ASM America, Inc., Phoenix, AZ (US)

(*) Notice: Subject to any disclaimer, the term of this patent is extended or adjusted under 35 U.S.C. 154(b) by 0 days.

(21) Appl. No.: 14/244,286

(22) Filed: Apr. 3, 2014

(65) Prior Publication Data
US 2014/0209177 A1 Jul. 31, 2014

Related U.S. Application Data

(62) Division of application No. 13/194,799, filed on Jul. 29, 2011, now Pat. No. 8,728,239.

(51) Int. Cl.
*C23C 16/52* (2006.01)
*H01L 21/67* (2006.01)

(52) U.S. Cl.
CPC .............................. *H01L 21/67017* (2013.01)
USPC ........................ 427/8; 427/248.1; 427/255.23

(58) Field of Classification Search
USPC ....................................... 427/8, 248.1, 255.23
See application file for complete search history.

(56) References Cited

U.S. PATENT DOCUMENTS

| 4,276,243 | A  | * | 6/1981  | Partus ............................ 261/128 |
| 5,904,952 | A  | * | 5/1999  | Lopata et al. ...................... 427/8 |
| 2005/0249873 | A1 | * | 11/2005 | Sarigiannis et al. ........ 427/248.1 |
| 2006/0037540 | A1 | * | 2/2006  | Woelk et al. ................... 118/726 |
| 2006/0216417 | A1 | * | 9/2006  | Todd et al. .................. 427/248.1 |
| 2007/0254093 | A1 | * | 11/2007 | Nijhawan et al. .................. 427/8 |
| 2008/0044573 | A1 | * | 2/2008  | Chen et al. ................ 427/255.28 |
| 2008/0141937 | A1 | * | 6/2008  | Clark ............................. 118/697 |
| 2011/0239860 | A1 | * | 10/2011 | Guan ................................. 95/22 |

OTHER PUBLICATIONS

Advanced Energy Industries, Inc. brochure: "Fundamentals of Mass Flow Control: Critical Terminology and Operation Principles for Gas and Liquid MFCs". 2005, pp. 1-5.*

* cited by examiner

*Primary Examiner* — Bret Chen
(74) *Attorney, Agent, or Firm* — The Noblitt Group, PLLC

(57) ABSTRACT

A gas panel according to various aspects of the present invention is configured to deliver a constant flow rate of gases to a reaction chamber during a deposition process step. In one embodiment, the gas panel comprises a deposition sub-panel having a deposition injection line, a deposition vent line, and at least one deposition process gas line. The deposition injection line supplies a mass flow rate of a carrier gas to a reactor chamber. Each deposition process gas line may include a pair of switching valves that are configured to selectively direct a deposition process gas to the reactor chamber or a vent line. The deposition vent line also includes a switching valve configured to selectively direct a second mass flow rate of the carrier gas that is equal to the sum of the mass flow rate for all of the deposition process gases to the reactor chamber or a vent line. The gas panel is configured to substitute the mass flow rate of the deposition vent line with the mass flow rate of the deposition process lines, such that when the deposition vent line is directed to the reactor chamber the deposition process lines are directed to the vent line and when the deposition vent line is directed to the vent line the deposition process lines are directed to the reactor chamber. The substitution of the two mass flow rates maintains a constant mass flow rate of gases to the reactor chamber throughout the deposition process step.

10 Claims, 8 Drawing Sheets

| | Stabilization | Deposition | Pump-down (purge) | Etch | Purge |
|---|---|---|---|---|---|
| Si3H8 | 200 (vent) | 200 (reactor) | 200 (vent) | 200 (vent) | 200 (vent) |
| SiH3CH3 | 50 (vent) | 50 (reactor) | 50 (vent) | 50 (vent) | 50 (vent) |
| PH3 | 750 (vent) | 750 (reactor) | 750 (vent) | 750 (vent) | 750 (vent) |
| Total process gas flow | 1000 | 1000 | 1000 | 1000 | 1000 |
| Deposition carrier gas flow | 9000 (reactor) | 9000 (reactor) | 9000 (reactor) | 9000 (reactor) | 9000 (reactor) |
| Vent carrier gas flow | 1000 (reactor) | 1000 (vent) | 1000 (reactor) | 1000 (reactor) | 1000 (reactor) |
| Total flow into reactor | 10000 | 10000 | 10000 | 10000 | 10000 |
| System pressure (Torr) | 50 | 50 | | 5-10 | |

FIGURE 5

| | | | | | | | | | | |
|---|---|---|---|---|---|---|---|---|---|---|
| deposition carrier | 20000 | 19900 | 19850 | 19350 | 19250 | 19150 | 19250 | 19350 | 19850 | 19900 |
| HCl | 0 | 100 | 100 | 100 | 100 | 100 | 100 | 100 | 100 | 100 |
| SiH4/DCS | 0 | 0 | 50 | 50 | 50 | 50 | 50 | 50 | 50 | 0 |
| GeH4 | 0 | 0 | 0 | 500 | 500 | 500 | 500 | 500 | 0 | 0 |
| MMS | 0 | 0 | 0 | 0 | 100 | 100 | 100 | 0 | 0 | 0 |
| B2H6 inject | 0 | 0 | 0 | 0 | 0 | 100 | 0 | 0 | 0 | 0 |
| AsH3 inject | 0 | 0 | 0 | 0 | 0 | 0 | 0 | 0 | 0 | 0 |
| H2 S/T | 20000 | 20000 | 20000 | 20000 | 20000 | 20000 | 20000 | 20000 | 20000 | 20000 |
| vent carrier | 150 | 250 | 300 | 800 | 900 | 1000 | 1000 | 1000 | 1000 | 1000 |
| HCl | 100 | 0 | 0 | 0 | 0 | | | | | |
| SiH4/DCS | 50 | 50 | 0 | 0 | 0 | | | | | |
| GeH4 | 500 | 500 | 500 | 0 | 0 | | | | | |
| MMS | 100 | 100 | 100 | 100 | 0 | | | | | |
| B2H6 | 100 | 100 | 100 | 100 | 100 | | | | | |
| total flow into vent | 1000 | 1000 | 1000 | 1000 | 1000 | 1000 | 1000 | 1000 | 1000 | 1000 |
| partial pressures in reactor: | | | | | | | | | | |
| HCl | 0 | 0.005 | 0.005 | 0.005 | 0.005 | 0.005 | 0.005 | 0.005 | 0.005 | 0.005 |
| SiH4/DCS | 0 | 0 | 0.0025 | 0.0025 | 0.0025 | 0.0025 | 0.0025 | 0.0025 | 0.0025 | 0 |
| GeH4 | 0 | 0 | 0 | 0.025 | 0.025 | 0.025 | 0.025 | 0.025 | 0 | 0 |
| MMS | 0 | 0 | 0 | 0 | 0.005 | 0.005 | 0.005 | 0 | 0 | 0 |
| B2H6 inject | 0 | 0 | 0 | 0 | 0 | 0.005 | 0 | 0 | 0 | 0 |
| AsH3 inject | 0 | 0 | 0 | 0 | 0 | 0 | 0 | 0 | 0 | 0 |

FIGURE 6

METHODS AND APPARATUS FOR A GAS PANEL WITH CONSTANT GAS FLOW

CROSS-REFERENCES TO RELATED APPLICATIONS

This application is a divisional patent application of U.S. patent application Ser. No. 13/194,799, filed on Jul. 29, 2011, now U.S. Pat. No. 8,728,239 and incorporates the disclosure of such application by reference. To the extent that the present disclosure conflicts with any referenced application, however, the present disclosure is to be given priority.

BACKGROUND OF THE INVENTION

As is well known, semiconductor processing is most commonly employed for the fabrication of integrated circuits, which entails particularly stringent quality demands, but such processing is also employed in a variety of other fields. For example, semiconductor processing techniques are often employed in the fabrication of flat panel displays using a wide variety of technologies and in the fabrication of microelectromechanical systems.

A variety of methods are used in the semiconductor manufacturing industry to deposit materials onto surfaces. For example, one of the most widely used methods is chemical vapor deposition, in which atoms or molecules contained in a precursor vapor deposit on a surface and build up to form a film. In some contexts, it is desirable to deposit selectively within semiconductor windows exposed among fields of different materials, such as field isolation oxide. For example, heterojunction bipolar transistors are often fabricated using selective deposition techniques that deposit epitaxial (single-crystal) semiconductor films only on active areas. Other transistor designs benefit from elevated source/drain structures, which provide additional silicon that can be consumed by the source/drain contact process without altering shallow junction device performance. Selective epitaxy on source/drain regions advantageously reduces the need for subsequent patterning and etch steps The film growth is based on surface reactions that take place on the surface of the substrate to form a solid-state layer of atoms or molecules, because the precursors and the temperature of the substrate are chosen such that the alternately injected vapor phase precursor's molecules react only on the substrate's surface layer. The precursors may also be injected in sufficiently high doses for the surface to be fully saturated during each injection cycle.

Multiple precursor pulses are needed to form various layers onto the substrate, and the pulses may have to be kept separated from each other to prevent uncontrolled growth of the film, contamination of the reactor chamber, or undesired reactions between precursors. After each pulse, the gaseous reaction products of the thin-film growth process as well as the excess reactants in vapor phase have to be removed from the reactor chamber. This can be achieved either by pumping down the reactor chamber or by purging the reactor chamber with a gas flow between successive pulses. For example, in the latter method, a column of an inactive or inert gas is introduced in the conduits between the precursor pulses. Regularly, the purging gas is also used as a carrier gas during precursor pulses.

In existing reactor chambers, process gases are commonly premixed together with some amount of a sweep purge carrier gas and stabilized to a vent before being combined with the main carrier gas and injected into the reactor chamber. For example, the pressure in a deposition line depends on the carrier gas flow, typically in the range of 10-100 standard liters per minute (slm), the resistance of the multiport injector causing a pressure drop, and the pressure downstream from the multiport injector inside the reactor chamber. When the pressure in the deposition line becomes steady the entire gas flow passes the multiport injector. However, if the deposition line pressure increases, the amount of gas entering the deposition line through one or more metering mass flow controllers exceeds the amount of mixed gas exiting the gas panel through the multiport injector. Conversely, if the deposition line pressure decreases, the amount of mixed gas exiting the gas panel through the multiport injector exceeds the amount of gas entering the deposition line through the metering mass flow controllers. This behavior can become very dynamic, in particular if:

large amounts of process gas were switched at the same time;

the steps are very short (and potentially repeated);

the amount of process gas relative to the carrier gas is high (small carrier flow);

the carrier gas flow is dramatically changed; and the reactor pressure downstream the multiport injector is changed (periodically).

By restricting the outlet of the vent with an adjustable needle valve the pressure in the vent line can be matched with the pressure in the deposition line. But this works only for one particular total flow, e.g. the highest process gas flows in the recipe, such as when a combination of gases comprising $H_2$, HCl, DCS/SiH$_4$, GeH$_4$, SiH$_3$CH$_3$, and/or B$_2$H$_6$ are flowing all together into the reactor chamber at the same time. To ensure the absence of Ge or B pressure spikes, it is common to introduce the gases in a certain order and to ramp some gases, such as GeH$_4$ and B$_2$H$_6$, slowly to an appropriate set point to avoid overdoping.

Using this method, the partial pressure of each individual gas changes when one or more additional gases are added or removed, even when the various mass flow controller set points for given gases are kept constant. To determine the right vent pressure, the process typically has to be run first and the pressure sensors monitored. Then the needle valve needs to be adjusted until the pressures are matched for the desired deposition step. This process is time consuming and can normally be done properly only for one production recipe. Changing the total gas flow also changes the gas velocity, the precursor partial pressures of the individual process gasses, and the composition over time all of which can affect the uniformity and the total thickness of the desired layer. This can be problematic for processes in the mass flow limited regime or in the transition region especially when using very low main carrier flows.

SUMMARY OF THE INVENTION

A gas panel according to various aspects of the present invention is configured to deliver a constant flow rate of gases to a reaction chamber during a deposition process step. In one embodiment, the gas panel comprises a deposition sub-panel having a deposition injection line, a deposition vent line, and at least one deposition process gas line. The deposition injection line supplies a mass flow rate of a carrier gas to a reactor chamber. Each deposition process gas line may include a pair of switching valves that are configured to selectively direct a deposition process gas to the reactor chamber or a vent line. The deposition vent line also includes a switching valve configured to selectively direct a second mass flow rate of the carrier gas that is equal to the sum of the mass flow rate for all of the deposition process gases to the reactor chamber or a vent line. The gas panel is configured to substitute the mass flow rate of the deposition vent line with the mass flow rate of the deposition process lines, such that when the deposition vent line is directed to the reactor chamber the deposition process lines are directed to the vent line and when the deposition vent line is directed to the vent line the deposition process lines are directed to the reactor chamber. The substitution of the two mass flow rates maintains a constant mass flow rate of gases to the reactor chamber throughout the deposition process step.

BRIEF DESCRIPTION OF THE DRAWINGS

A more complete understanding of the present invention may be derived by referring to the detailed description and claims when considered in connection with the following illustrative figures. In the following figures, like reference numbers refer to similar elements and steps throughout the figures.

FIG. 5 representatively illustrates a sample flow pattern for the deposition sub-panel in accordance with an exemplary embodiment of the present invention; and FIG. 6 representatively illustrates a constant partial pressure for each deposition process gas in the reactor chamber across multiple combinations of deposition process gases.

Elements and steps in the figures are illustrated for simplicity and clarity and have not necessarily been rendered according to any particular sequence. For example, steps that may be performed concurrently or in a different order are illustrated in the figures to help to improve understanding of embodiments of the present invention.

DETAILED DESCRIPTION OF EXEMPLARY EMBODIMENTS

The present invention may be described in terms of functional block components and various processing steps. Such functional blocks may be realized by any number of hardware or software components configured to perform the specified functions and achieve the various results. For example, the present invention may employ various sensors, detectors, flow control devices, valves, and the like, which may carry out a variety of functions. In addition, the present invention may be practiced in conjunction with any number of processing methods, and the system described is merely one exemplary application for the invention. Further, the present invention may employ any number of conventional techniques for delivering various gases, injecting flow rates, controlling mass flow rates of gases, and the like.

Methods and apparatus for a gas panel with constant gas flow according to various aspects of the present invention may operate in conjunction with any suitable manufacturing system or device. Various implementations of the present invention may be applied to any system for injecting multiple pulses of various precursor gases onto a substrate positioned within a reactor space. Certain representative implementations may also include, for example, vapor phase epitaxy (VPE), atomic layer deposition (ALD) processes, precursor delivery systems for thin film deposition, and similar semiconductor processing methods.

Figure 1:
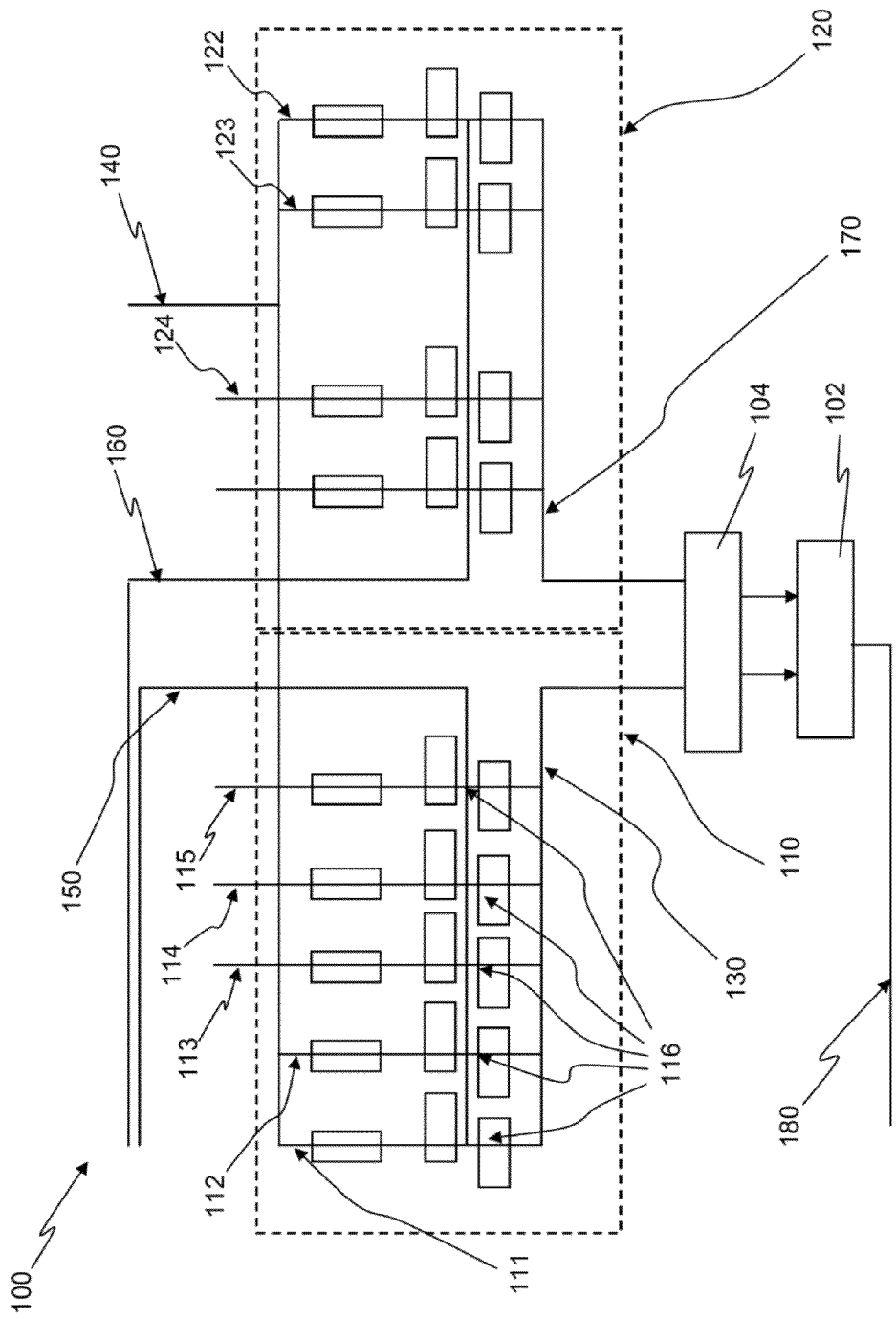
FIG. 1 representatively illustrates a gas panel according to various aspects of the present invention.

Referring now to FIG. 1, a gas panel 100 for providing a constant mass flow rate of gases according to various aspects of the present invention may comprise a deposition sub-panel 110 and an etch sub-panel 120. The deposition sub-panel 110 may provide deposition process gases to the reactor chamber 102 during a deposition process step. The etch sub-panel 120 may provide etch process gases to the reactor chamber 102 during an etch process step. The gas panel 100 may be coupled to the reactor chamber 102 by an injector system 104 such that gases from each sub-panel may be routed to the reactor chamber 102 through the injector system 104. The gas panel 100 may further comprise or be suitably configured to couple to a venting system (not shown) via a deposition vent line 150 and an etch vent line 160. The gas panel 100 may also comprise one or more additional deposition sub-panels (not shown) to facilitate additional deposition process steps using different deposition process gases.

The reactor chamber 102 may comprise any suitable sealed volume that is configured to receive injected process gases. For example, in one embodiment, the reactor chamber 102 may comprise a single wafer, single pass, laminar horizontal gas flow chamber that is radiantly heated. The reactor chamber 102 may also be configured to rotate the substrate during one or more process steps such as deposition, purge, etch, and the like. The reactor chamber 102 may be further configured to be pressurized during operation to facilitate flow of the injected process gases in a desired direction.

The venting system may comprise any suitable system for filtering and/or treating process gases and/or carriers gases used by the gas panel 100. For example, the venting system may comprise a scrubber or burnbox to treat the vented gases. The venting system may also be configured to prevent potentially reactive process gases from coming into contact with each other. For example, process gases sent to the venting system via the deposition vent line 150 and the etch vent line 160 may be routed through separate conduits until the process gases have been sufficiently treated to negate any reactive properties between various process gases. The venting system may also be coupled to the reactor chamber 102 via a reactor vent line 180 to facilitate the outflow of injected process gases from the reactor chamber 102.

Figure 2A:
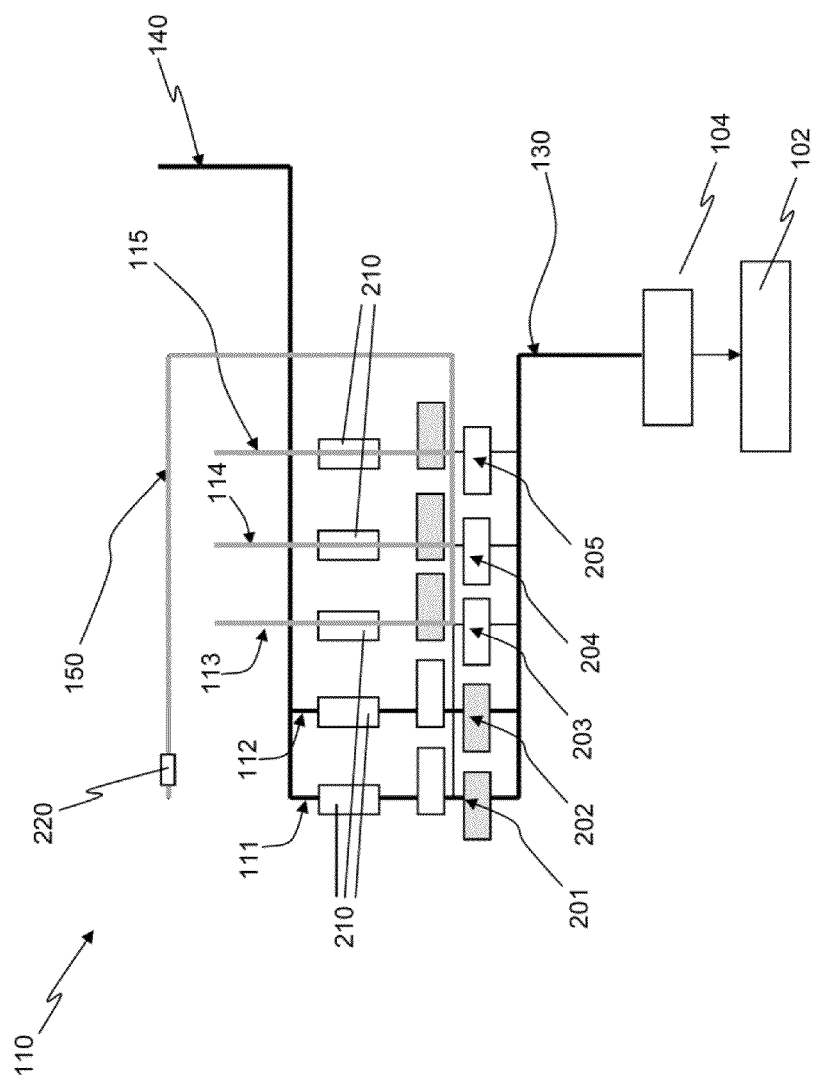
FIG. 2A representatively illustrates a deposition sub-panel in a first state to direct all carrier gases to a reactor chamber and all deposition process gases to a vent.

Referring now to FIG. 2A, the deposition vent line 150 may comprise an adjustable valve 220, such as a needle valve, for adjusting pressure in the deposition vent line 150. Controllably adjusting the pressure in the deposition vent line 150 to equal a second pressure in a deposition injection line 130 helps ensure a steady and constant gas flow to the injector system 104.

The deposition sub-panel 110 is suitably adapted to supply a constant total reactor flow to the reactor chamber 102 at all times. The deposition sub-panel 110 may comprise any suitable device or system for directing an appropriate mass flow rate of one or more gases to the reactor chamber 102. For example, referring now to FIGS. 1 and 2A, in one embodiment the deposition sub-panel 110 may comprise one or more deposition process gas lines 113, 114, 115, a deposition carrier gas line 111, and a vent carrier gas line 112, wherein each gas line may be coupled to the deposition injector line 130 and the deposition vent line 150 by a valve 116. The deposition sub-panel 110 may also comprise one or more mass flow controllers 210 for controlling a mass flow rate of a given gas line.

The mass flow controller 210 may be adapted to selectively adjust a mass flow rate of a given carrier gas line 111, 112 and/or process gas line 113, 114, 115 entering a valve 116. The mass flow controller 210 may comprise any suitable device or system for metering the mass flow rate of a gas. In one embodiment, each mass flow controller 210 may comprise an electro-mechanical device adapted to be responsive to a command from a control system to provide a desired mass flow rate for a gas according to a predetermined deposition process.

The process gas lines 113, 114, 115 may comprise any suitable system or device for routing a deposition process gas from a supply source to the reactor chamber 102 of the deposition sub-panel 110. For example, the process gas lines 113, 114, 115 may comprise a conduit or pipe and be constructed of any suitable material such as stainless steel. Each process gas line 113, 114, 115 may be coupled to a different deposition process gas such as Silcore ($Si_3H_8$), methylsilane ($SiH_3CH_3$), phosphine ($PH_3$), germane ($GeH_4$), and diborane ($B_2H_6$). The process gas lines 113, 114, 115 may also be suitably routed such that the deposition process gas contained within a particular process gas line 113, 114, 115 is delivered to the deposition sub-panel 110 in a substantially pure form, i.e not having been mixed with any other deposition process gas.

Each of the process gas lines 113, 114, 115 may be coupled to a single mass flow controller 210 adapted to control the mass flow rate of the deposition process gas that is subsequently passed on to the deposition injection line 130 and/or the deposition vent line 150. Once the deposition process gases have passed to either the deposition injection line 130 or the deposition vent line 150, they mix together to form a stabilized mixture of deposition process gases. The sum of all of the deposition process gas mass flow rates exiting the mass flow controllers connected to the process gas lines 113, 114, 115 are used to calculate the total reactor flow.

A carrier gas line may comprise any suitable system or device for routing a carrier gas from a supply source to the deposition sub-panel 110. In one embodiment, the carrier gas lines may comprise one or more conduits or pipes and may be constructed of any suitable material such as stainless steel. For example, a main carrier gas line 140 may be configured to direct a carrier gas, such as Ar, He, $H_2$, or $N_2$, to the deposition carrier gas line 111 and the vent carrier gas line 112.

Similar to the process gas lines 113, 114, 115, the deposition carrier gas line 111 and the vent carrier gas line 112 may be coupled to a mass flow controller 210 adapted to control the mass flow rate of the carrier gas that is subsequently passed on to the deposition injection line 130 and/or the deposition vent line 150. However, unlike the stabilized mixture of deposition process gases, the carrier gas in the deposition carrier gas line 111 and the vent carrier gas line 112 are not permanently combined together. For example, in a representative embodiment of the present invention, the mass flow rate of the carrier gas in the deposition carrier gas line 111 may be kept constant and always directed to the deposition injection line 130. The mass flow controller 210 coupled to the vent carrier gas line 112 may be configured to equilibrate the mass flow rate of the carrier gas in the vent carrier gas line 112 with the sum of the mass flow rates of the process gas lines 113, 114, 115.

Therefore, to maintain a constant total reactor flow, the equilibrated mass flow rate of the carrier gas in the vent carrier gas line 112 is directed to the deposition injection line 130 when the stabilized mixture of deposition process gases is directed to the deposition vent line 150. Conversely, the equilibrated mass flow rate of the carrier gas in the vent carrier gas line 112 is directed to the deposition vent line 150 when the stabilized mixture of deposition process gases is directed to the deposition injection line 130.

Figure 2B:
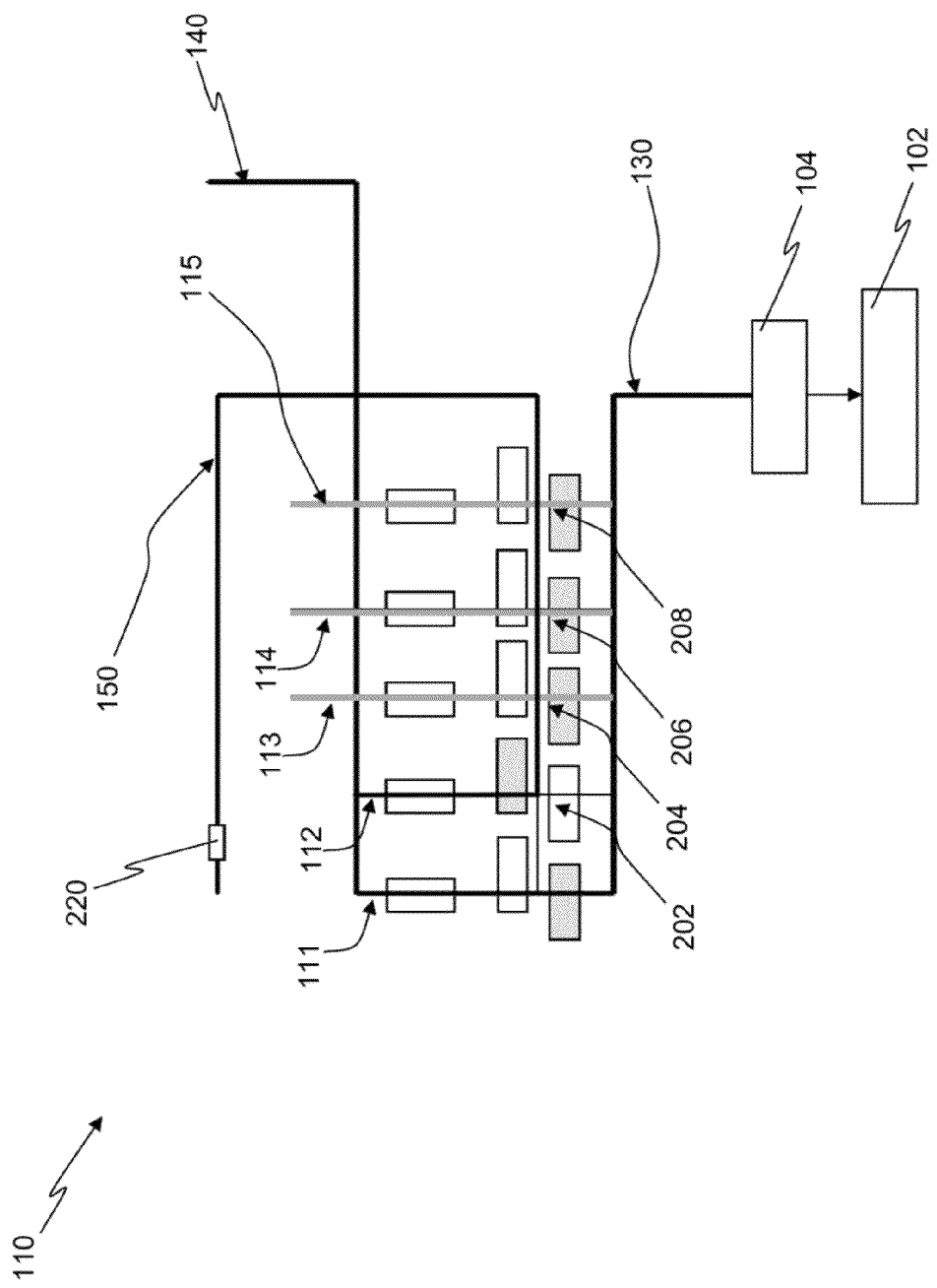
FIG. 2B representatively illustrates a deposition sub-panel in a second state to direct one carrier gas line and all deposition process gases to the reactor chamber and a second carrier gas line to the vent.

The valves 116 are adapted to selectively direct an incoming mass flow rate of gas from the mass flow controller 210 to the deposition injection line 130 or the deposition vent line 150. The valves 116 may comprise any suitable device or system for controlling the flow path of a gas. Referring now to FIGS. 2A and 2B, in one embodiment, the valves 116 may comprise a plurality of valve pairs 201, 202, 203, 204, 205 coupled to a gas line by a mass flow controller 210. For example, a first valve pair 202 may comprise two independent valves configured to function in opposition to one another such that when one of the independent valves is open the other is closed. The positioning of the independent valves in the first valve pair 202 may also determine whether the carrier gas in the vent carrier gas line 112 is directed to the deposition injection line 130 or the deposition vent line 150. Alternatively, each valve 116 may comprise a single switching valve configured to selectively direct the incoming mass flow rate of a gas to either the deposition injection line 130 or the deposition vent line 150.

The valves 116 may also be actuated by any suitable method. For example, the actuation of each valve 116 may be controlled by the control system, wherein one or more valves may be commanded to open or close depending upon a given process step in the cyclic deposition and etch process. The valves 116 may also be suitably adapted to open and close at a sufficient rate to facilitate a deposition cycle on the order of one second.

Referring again to FIG. 1, the etch sub-panel 120 may comprise any suitable device or system for directing an appropriate mass flow rate of one or more etch process gas lines 124, an etch carrier vent line 123, and an etch carrier injection line 122 to the reactor chamber 102 and/or the venting system. The etch sub-panel 120 may be configured with a plurality of valves, mass flow controllers, and gas lines in substantially the same manner as the deposition sub-panel 110 to supply a constant total reactor flow to the reactor chamber 102 through an etch injection line 170 at all times. However, depending upon a desired etch process, it may not be necessary for the etch sub-panel 120 to provide a constant total reactor flow to the reactor chamber 102 during the entire cyclic deposition and etch process. Therefore, the etch sub-panel 120 may be suitably adapted to function in either a constant total reactor flow mode or vary mass flow output to the reactor chamber 102 over time.

The etch sub-panel 120 may also be configured such that the etch injection line 170 and the etch vent line 160 are completely separated from the deposition injection line 130 and the deposition vent line 105 to prevent any undesired mixing of deposition process gases and etch process gases. The etch injection line 170 and the deposition injection line 130 may be further segregated through separate connections to the injector system 104. The etch injection line 170 may also be configured to be of equal length to the deposition injection line 130 to help ensure a similar injection rate of process and carrier gases to the injector system 104.

The injector system 104 may comprise any suitable device or system for injecting the carrier and process gases into the reactor chamber 102. In one embodiment, the injector system 104 may comprise a multiport injector suitably configured to separately inject deposition process gases and etch gases into the reactor chamber 102. For example, the multiport injector may comprise multiple inlets for each sub-panel, wherein each inlet is coupled to an injector. Each inlet may also be configured to couple to any suitable device for selectively adjust an incoming mass flow rate of gases. For example, each inlet may be coupled to an adjustable needle valve for making adjustments to the mass flow rate provided to each injector. The needle valve may be adjusted either manually or automatically according to a particular gas mixture recipe or desired deposition process. The control system may monitor each inlet and automatically adjust one or more needle valves to maintain a desire pressure or mass flow rate.

Figure 4A:
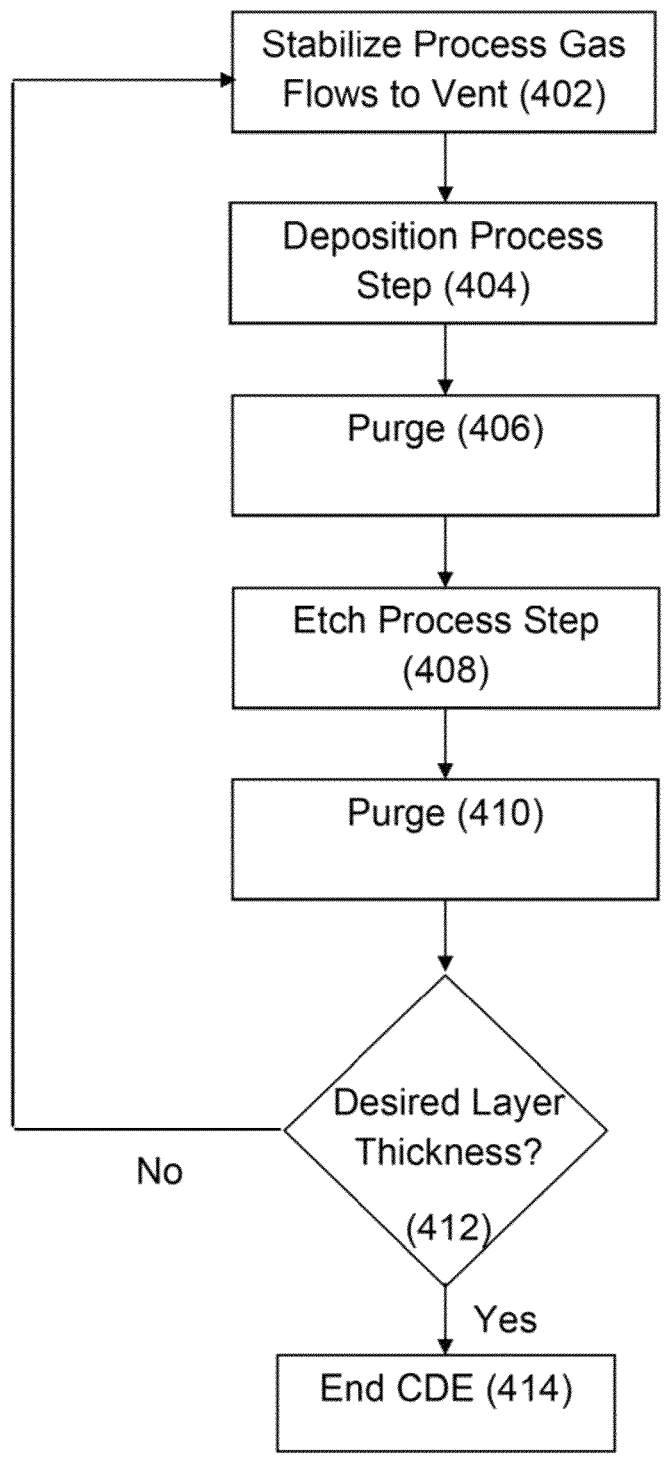
FIG. 4A is a flow chart of a single cycle of a deposition and etch process in accordance with an exemplary embodiment of the present invention.

Referring now to FIG. 4A, an example of a complete cyclic deposition and etch process comprises stabilizing the deposition process gases and the etch process gas to the venting system (402). Each of the deposition and etch process gas mass flow rates is determined by a pre-calculated formula or recipe according to a desired layer thickness for the cycle. Once the process gas flows are stabilized, the deposition process gases are redirected from the deposition vent line 150 to the deposition injection line 130 (404) and into the reactor chamber 102 for a predetermined amount of time. In one exemplary embodiment, the process step time for deposition may be on the order of one second. Following deposition, the deposition process gases are redirected from the deposition injection line 130 to the deposition vent line 150 to purge the reactor chamber 102 (406). After the reactor chamber 102 has been purged of the deposition process gases, the etch process gas is redirected from the etch vent line 160 to the etch injection line 170 (408) and into the reactor chamber 102 for a predetermined amount of time. Following etch, the etch process gas is redirected from the etch injection line 170 back to the etch vent line 160 to purge the reactor chamber 102 of the etch process gas (410). Following the second purging of the reactor chamber 102, if the desired layer thickness has been achieved on the substrate then the cyclic deposition and etch process is completed (414), if not, then the process is repeated until the desired thickness is achieved.

Figure 4B:
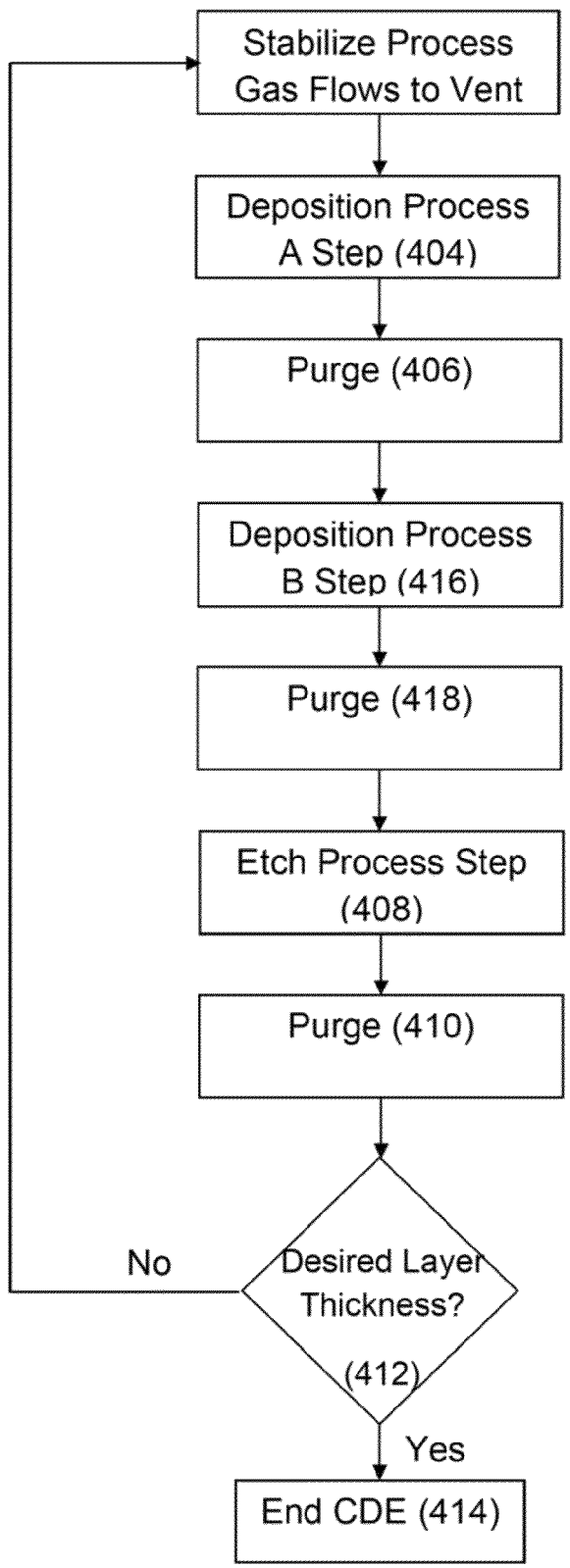
FIG. 4B is a flow chart of a single cycle of a deposition and etch process having multiple deposition steps in accordance with an exemplary embodiment of the present invention.

Alternatively, referring now to FIG. 4B, the cyclic deposition and etch process may comprise more than one deposition step. For example, a second deposition process gas supplied from a second deposition sub-panel may be injected following the purging of the reactor chamber 102 after the initial deposition process step (416). This second process gas may then be purged from the reactor chamber 102 in a manner similar to the first deposition process gas prior to etch process step (418).

Figure 3:
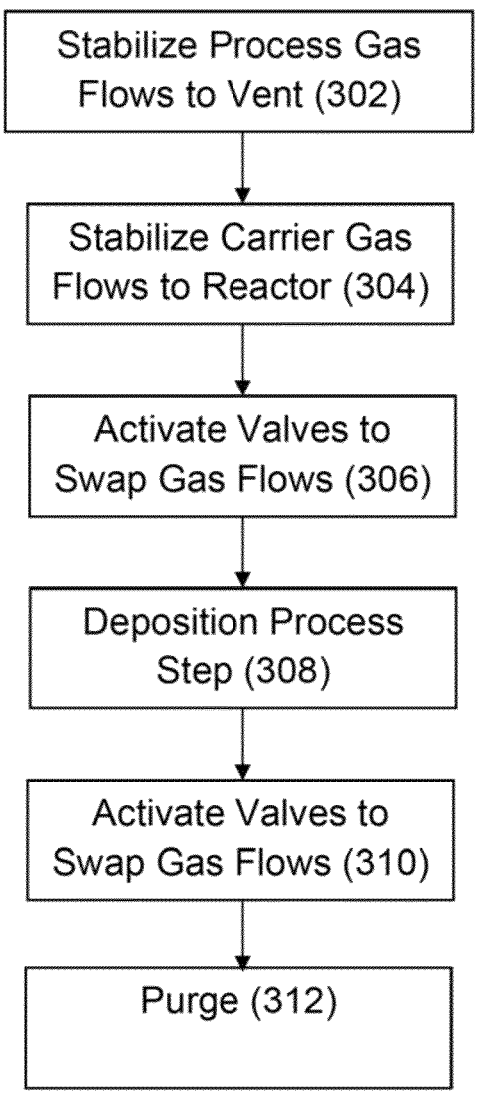
FIG. 3 is a flow chart of a process for maintaining a constant total mass flow rate in the deposition sub-panel in accordance with an exemplary embodiment of the present invention.

In operation, the deposition sub-panel 110 is configured to provide a constant mass flow rate of one or more gases to the reactor chamber throughout the entire cyclic deposition and etch process. Referring now to FIGS. 2A and 3, prior to initiating the deposition process step, the deposition process gases are stabilized to the venting system (302). For example, a first process gas line 113 provides a first deposition process gas such as $PH_3$ to a first mass flow controller 210 coupled to the first process gas line 113. The first deposition process gas is then passed to a first valve 203 at a predetermined mass flow rate. Similarly, a second process gas line 114 provides a second deposition process gas such as MMS to a second mass flow controller 210 that is coupled to a second valve 204 and a third process gas line 115 provides a third deposition process gas such as $Si_3H_8$ to a third mass flow controller 210 that is coupled to a third valve 205. Each of the first, second, and third valves 203, 204, 205 are initially disposed in a first state such that the mass flow rate of all of the deposition process gases are directed to the deposition vent line 150.

Substantially simultaneously with the stabilization of the deposition process gases, the carrier gas flows are stabilized to the reactor chamber 102 (304). For example, the deposition carrier gas line 111 provides a carrier gas such as Ar, He, $H_2$, or N to the reactor chamber 102 at a predetermined mass flow rate. A second flow of the carrier gas is provided to a fourth mass flow controller 210 coupled to the vent carrier gas line 112. The second flow of the carrier gas is then passed to a fourth valve 202 at a mass flow rate equal to the combined mass flow rate for the three deposition process gases. The fourth valve 202 is initially disposed in the first state such that the mass flow rate of the carrier gas is directed to the deposition injection line 130.

Once the gas flows to the reactor chamber 102 and the venting system have been stabilized, the deposition process step is initiated by activating the first, second, third, and fourth valves 203, 204, 205, 202 (306). Referring now to FIG. 2B, each of the valves is changed from the first state to a second state, wherein the mass flow rate of all of the deposition process gases are redirected to the deposition injection line 130 and the mass flow rate of the carrier gas in the vent carrier gas line 112 is redirected to the deposition vent line 150. Because the mass flow rate of the vent carrier gas line 112 is equal to the mass flow rate of all of the deposition process gases in process gas line 113, 114, 115, the total mass flow rate to the reactor chamber 102 is unchanged.

At the end of the deposition process step, the first, second, third, and fourth valves 203, 204, 205, 202 are activated again and return to the first state (310), wherein the mass flow rate of all of the deposition process gases are redirected back to the deposition vent line 150 and the mass flow rate of the carrier gas in the vent carrier gas line 112 is redirected back to the deposition injection line 130. Again, because the mass flow rate of the vent carrier gas line 112 is equal to the mass flow rate of all of the deposition process gases, the total mass flow rate to the reactor chamber 102 is unchanged. The return of the first, second, third, and fourth valves 203, 204, 205, 202 to the first state also has the effect of purging the reactor chamber 102 of any deposition process gases (312). The first, second, third, and fourth valves 203, 204, 205, 202 then remain in the first state for the remainder of the deposition and etch process cycle.

Referring now to FIG. 5, the effect of equilibrating the mass flow rate of the vent carrier gas line 112 to the mass flow rate of all of the deposition process gases allows the total flow and gas velocity into the reactor chamber 102 from the deposition sub-panel to remain constant across each process step of the deposition and etch process cycle and reduces the potential for dopant spiking when gases are added to the reactor chamber 102. Maintaining a constant total reactor flow in the manner described also allows for fast and accurate gas switching, increases the predictability and repeatability of a given deposition process step, and allows the deposition sub-panel to operate efficiently with shorter deposition process time steps, which may be determined only by the rate at which the valves 116 can activate between states.

Referring now to FIG. 6, maintaining constant total reactor flow by adjusting the vent carrier gas line 112 to equal the mass flow rate of all of the deposition process gases also allows the partial pressure of each deposition process gas to remain the same across multiple combinations of deposition process gases used during a deposition process step. This further reduces the likelihood of pressure spiking among the deposition process gases.

These and other embodiments for methods and apparatus for a gas panel with constant gas flow may incorporate concepts, embodiments, and configurations as described with respect to embodiments of apparatus for controlling mass flow rates of various gases as described above. The particular implementations shown and described are illustrative of the invention and its best mode and are not intended to otherwise limit the scope of the present invention in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationships or physical connections may be present in a practical system.

The invention has been described with reference to specific exemplary embodiments. Various modifications and changes, however, may be made without departing from the scope of the present invention. The description and figures are to be regarded in an illustrative manner, rather than a restrictive one and all such modifications are intended to be included within the scope of the present invention. Accordingly, the scope of the invention should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present invention and are accordingly not limited to the specific configuration recited in the specific examples.

Benefits, other advantages and solutions to problems have been described above with regard to particular embodiments; however, any benefit, advantage, solution to problems or any element that may cause any particular benefit, advantage or solution to occur or to become more pronounced are not to be construed as critical, required or essential features or components.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

The present invention has been described above with reference to an exemplary embodiment. However, changes and modifications may be made to the exemplary embodiment without departing from the scope of the present invention. These and other changes or modifications are intended to be included within the scope of the present invention, as expressed in the following claims.

The invention claimed is:

1. A method for supplying a constant flow rate of carrier and deposition process gases to a reaction chamber of a cyclic deposition and etch system, comprising:
    directing a first mass flow rate of a carrier gas from a deposition sub-panel to the reaction chamber through an injection line;
    directing a mass flow rate of at least one deposition process gas from the deposition sub-panel to a vent line during a first state in response to a first command from a control system;
    directing a second mass flow rate of the carrier gas from the deposition sub-panel to the reaction chamber through the injection line during the first state, in response to the first command from the control system wherein:
        the second mass flow rate of the carrier gas is combined with the first mass flow rate of the carrier gas prior to entering the reactor chamber; and
        the second mass flow rate of the carrier gas is adjusted by the control system to equal the mass flow rate of the at least one deposition process gas;
    redirecting the second mass flow rate of the carrier gas from the deposition sub-panel to the vent line during the second state in response to a second command from the control system; and
    redirecting the mass flow rate of the at least one deposition process gas from the deposition sub-panel to the reaction chamber through the injection line during a second state in response to the second command from the control system, wherein the mass flow rate of the at least one deposition process gas is combined with the first mass flow rate of the carrier gas prior to entering the reactor chamber.

2. A method for supplying a constant flow rate of carrier and deposition process gases to a reaction chamber of a cyclic deposition and etch system according to claim 1, wherein the first and second states are repeated over a predetermined period of time.

3. A method for supplying a constant flow rate of carrier and deposition process gases to a reaction chamber of a cyclic deposition and etch system according to claim 1, wherein the second state comprises a deposition process step.

4. A method for supplying a constant flow rate of carrier and deposition process gases to a reaction chamber of a cyclic deposition and etch system according to claim 1, wherein directing and redirecting the carrier and deposition process gases comprises:
    coupling a first valve system to the injection line and the vent line, wherein the first valve system is configured to:
        seal off the second mass flow rate of the carrier gas from the vent line during the first state in response to the first command from the control system; and
        seal off the second mass flow rate of the carrier gas from the injection line during the second state in response to the second command from the control system; and
    coupling a second valve system to the injection line and the vent line, wherein the second valve system is configured to:
        seal off the mass flow rate of at least one deposition process gas from the injection line during the first state in response to the first command from the control system; and
        seal off the mass flow rate of at least one deposition process gas from the vent line during the second state in response to the second command from the control system.

5. A method for supplying a constant flow rate of carrier and deposition process gases to a reaction chamber of a cyclic deposition and etch system, comprising:

stabilizing a mass flow rate of a deposition process gas from a deposition sub-panel through a first valve to a vent line;

stabilizing a first mass flow rate of a carrier gas from the deposition sub-panel through an injection line linked to the reaction chamber;

stabilizing a second mass flow rate of the carrier gas from the deposition sub-panel through a second valve to the reaction chamber through the injection line, wherein the second mass flow rate of the carrier gas is adjusted by a control system to equal the mass flow rate of the deposition process gas;

initiating a deposition process by substantially simultaneously activating the first and second valves in response to a first command from the control system, wherein:

activation of the first valve causes the mass flow rate of the deposition process gas to be redirected from the vent line to the injection line, wherein the mass flow rate of the deposition process gas is combined with the first mass flow rate of the carrier gas prior to entering the reactor chamber; and activation of the second valve causes the second mass flow rate of the carrier gas to be redirected from the injection line to the vent line.

6. A method for supplying a constant flow rate of carrier and deposition process gases according to claim 5, further comprising initiating a purge process by substantially simultaneously activating the first and second valves in response to a second command from the control system, wherein:

activation of the first valve causes the mass flow rate of the deposition process gas to be redirected from the injection line to the vent line; and activation of the second valve causes the second mass flow rate of the carrier gas to be redirected from the vent line to the injection line, wherein the second mass flow rate of the carrier gas is combined with the first mass flow rate of the carrier gas prior to entering the reactor chamber.

7. A method for supplying a constant flow rate of carrier and deposition process gases according to claim 5, further comprising:

coupling a first mass flow controller to the mass flow rate of the deposition process gas, wherein the first mass flow controller is responsive to the control system and configured to supply a predetermined mass flow rate of the deposition process gas to the first valve; and coupling a second mass flow controller to the second mass flow rate of the carrier gas, wherein the second mass flow controller is responsive to the control system and configured to adjust the second mass flow rate of the carrier gas supplied to the second valve.

8. A method for supplying a constant flow rate of carrier and deposition process gases according to claim 5, further comprising:

stabilizing a second mass flow rate of a second deposition process gas from the deposition sub-panel through a third valve to the vent line;

adjusting, by the control system, the second mass flow rate of the carrier gas to equal a combined mass flow rate of the first and second deposition process gases;

initiating the deposition process by substantially simultaneously activating the first, second, and third valves in response to the first command from the control system, wherein:

activation of the first and third valve causes the combined mass flow rate of the first and second deposition process gases to be redirected from the vent line to the injection line, wherein the combined mass flow rate of the first and second deposition process gases are combined with the first mass flow rate of the carrier gas prior to entering the reactor chamber; and activation of the second valve causes the second mass flow rate of the carrier gas to be redirected from the injection line to the vent line.

9. A method for supplying a constant flow rate of carrier and deposition process gases according to claim 8, further comprising initiating a purge process by substantially simultaneously activating the first, second, and third valves in response to a second command from the control system, wherein:

activation of the first and second valves causes the combined mass flow rate of the first and second deposition process gases to be redirected from the injection line to the vent line; and activation of the second valve causes the second mass flow rate of the carrier gas to be redirected from the vent line to the injection line, wherein the second mass flow rate of the carrier gas is combined with the first mass flow rate of the carrier gas prior to entering the reactor chamber.

10. A method for supplying a constant flow rate of carrier and deposition process gases according to claim 8, further comprising:

coupling a first mass flow controller to the mass flow rate of the deposition process gas, wherein the first mass flow controller is responsive to the control system and configured to supply a predetermined mass flow rate of the deposition process gas to the first valve;

coupling a second mass flow controller to the second mass flow rate of the second deposition process, wherein the second mass flow controller is responsive to the control system and configured to supply a predetermined mass flow rate of the second deposition process gas to the third valve; and coupling a third mass flow controller to the second mass flow rate of the carrier gas, wherein the second mass flow controller is responsive to the control system and configured to adjust the second mass flow rate of the carrier gas supplied to the second valve.

\* \* \* \* \*